(12) United States Patent
Tanaka et al.

(10) Patent No.: US 9,819,148 B2
(45) Date of Patent: Nov. 14, 2017

(54) METHOD FOR CONTROLLING TUNABLE WAVELENGTH LASER

(71) Applicant: Sumitomo Electric Device Innovations, Inc., Yokohama (JP)

(72) Inventors: Hirokazu Tanaka, Yokohama (JP);
Masao Shibata, Yokohama (JP);
Mitsuyoshi Miyata, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 45 days.

(21) Appl. No.: 14/473,725

(22) Filed: Aug. 29, 2014

(65) Prior Publication Data
US 2015/0063383 A1    Mar. 5, 2015

(30) Foreign Application Priority Data

Aug. 30, 2013  (JP) .................................. 2013-180166

(51) Int. Cl.
*H01S 3/10*    (2006.01)
*H01S 5/0687*    (2006.01)
(Continued)

(52) U.S. Cl.
CPC ........ *H01S 5/0687* (2013.01); *H01S 5/06256* (2013.01); *H01S 5/0265* (2013.01);
(Continued)

(58) Field of Classification Search
CPC ...... H01S 5/024; H01S 5/0245; H01S 5/0612; H01S 5/068; H01S 5/0687; H01S 5/141;
(Continued)

(56) References Cited

U.S. PATENT DOCUMENTS

| | | | |
|---|---|---|---|
| 7,929,581 B2 * | 4/2011 | Ishikawa ............... | H01S 5/0687 372/20 |
| 2011/0200062 A1 * | 8/2011 | Shibata ................. | H01S 5/0617 372/20 |

(Continued)

FOREIGN PATENT DOCUMENTS

JP    2009-026996 A    2/2009

*Primary Examiner* — Jessica Manno
*Assistant Examiner* — Delma R Forde
(74) *Attorney, Agent, or Firm* — Venable LLP; Michael A. Santori; Laura G. Remus

(57) ABSTRACT

A driving condition for causing the tunable wavelength laser to conduct laser oscillation at a first wavelength is acquired. a driving condition for causing the tunable wavelength laser to conduct laser oscillation at the second wavelength is calculated. The tunable wavelength laser is driven based on the driving condition of the second wavelength, feedback control that changes the driving condition of the tunable wavelength laser based on a difference between an output of the wavelength sensing unit and the target value is performed, and the tunable wavelength laser is caused to oscillate at the second wavelength. The driving condition of the tunable wavelength laser obtained by the feedback control when oscillation has occurred at the second wavelength is stored in the memory. Thereafter, the tunable wavelength laser is driven with reference to the stored driving condition of the tunable wavelength laser.

5 Claims, 12 Drawing Sheets

(51) Int. Cl.
*H01S 5/0625* (2006.01)
*H01S 5/026* (2006.01)
*H01S 5/06* (2006.01)
*H01S 5/12* (2006.01)

(52) U.S. Cl.
CPC ......... *H01S 5/0617* (2013.01); *H01S 5/06258* (2013.01); *H01S 5/1209* (2013.01); *H01S 5/1212* (2013.01)

(58) Field of Classification Search
CPC .. H01S 5/0683; H01S 5/06832; H01S 5/0427; H01S 5/042; H01S 5/06256; H01S 5/0265; H01S 5/0617; H01S 5/06258; H01S 5/1209; H01S 5/1212
USPC .......................................... 372/20, 32, 38.01
See application file for complete search history.

(56) References Cited

U.S. PATENT DOCUMENTS

| | | | |
|---|---|---|---|
| 2014/0036940 A1* | 2/2014 | Tanaka | H01S 5/0617 372/20 |
| 2015/0036705 A1* | 2/2015 | Tanaka | H01S 5/06256 372/29.011 |
| 2015/0063384 A1* | 3/2015 | Miyata | H01S 5/06256 372/20 |
| 2015/0117479 A1* | 4/2015 | Miyata | H01S 5/0683 372/20 |
| 2015/0117482 A1* | 4/2015 | Shibata | H01S 3/04 372/34 |
| 2015/0155679 A1* | 6/2015 | Miyata | H01S 3/106 372/20 |
| 2015/0188284 A1* | 7/2015 | Miyata | H01S 5/0687 372/20 |
| 2015/0222077 A1* | 8/2015 | Miyata | H01S 5/02415 372/20 |
| 2015/0222078 A1* | 8/2015 | Miyata | H01S 5/02415 372/20 |

* cited by examiner

Fig.3

| Ch | INITIAL SETTING VALUES | | | | | | | | FEEDBACK CONTROL TARGET VALUES | | TEMPERATURE CORRECTION COEFFICIENT |
|---|---|---|---|---|---|---|---|---|---|---|---|
| | $I_{LD}$ [mA] | $I_{SOA}$ [mA] | $T_{LD}$ [degC] | $T_{Etalon}$ [degC] | $P_{Heater1}$ [mW] | $P_{Heater2}$ [mW] | $P_{Heater3}$ [mW] | | $I_{m1}$ [µA] | $I_{m2}/I_{m1}$ A.U. | $C_1$ [GHz/°C] |
| 1 | 150.00 | 67.39 | 52.508 | 50.000 | 29.42 | 57.47 | 50.69 | | 315.0 | 1.175 | -0.7 |
| 2 | 150.00 | 47.74 | 34.533 | 50.000 | 64.38 | 81.31 | 72.45 | | 317.5 | 1.518 | |
| 3 | 150.00 | 50.86 | 38.727 | 50.000 | 59.05 | 77.71 | 69.12 | | 313.0 | 1.229 | |
| ... | ... | ... | ... | ... | ... | ... | ... | | ... | ... | |
| n | 150.00 | 54.77 | 54.046 | 50.000 | 41.24 | 43.32 | 11.69 | | 317.2 | 1.441 | |

Fig.8

| WAVELENGTH INFORMATION [THz] | REQUIRED WAVELENGTH SETTING VALUE ||||||||
|---|---|---|---|---|---|---|---|
| | $I_{LD}$ [mA] | $I_{SOA}$ [mA] | $T_{LD}$ [degC] | $T_{Etalon}$ [degC] | $P_{Heater1}$ [mW] | $P_{Heater2}$ [mW] | $P_{Heater3}$ [mW] |
| 190.100 | 150.00 | 67.39 | 52.148 | 48.771 | 29.42 | 57.47 | 50.69 |

Fig.11

| | TEMPERATURE CORRECTION AMOUNT |
|---|---|
| WAVELENGTH INFORMATION [THz] | ΔT [°C] |
| 190.100 | 0.5 |

METHOD FOR CONTROLLING TUNABLE WAVELENGTH LASER

FIELD OF THE INVENTION

The present invention relates to a method for controlling a tunable wavelength laser.

BACKGROUND OF THE INVENTION

A tunable wavelength laser having a selectable output wavelength is disclosed in Laid-open Japanese Patent Publication No. 2009-026996, for example.

SUMMARY OF THE INVENTION

According to the technology of Patent Literature (Laid-open Japanese Patent Publication No. 2009-026996), control conditions for obtaining grid wavelengths determined by ITU-T (International Telecommunication Union Telecommunication Standardization Sector) (hereinafter, simply referred to as grid wavelengths) are stored in a memory. A control is conducted so that oscillation occurs at any wavelength of the grid wavelengths based on the stored control conditions. For this reason, it is impossible to perform a control so that oscillation occurs at any wavelength other than the grid wavelengths. In this regard, it is considered to cause oscillation at a wavelength other than the grid wavelengths by calculating setting values based on initial setting values for implementing the grid wavelengths. However, obtaining setting values at each calculation lengthens the time necessary for start-up.

The present invention has been made in view of the above-mentioned problems, and it is an aspect of the present invention to provide a method for controlling a tunable wavelength laser capable of shortening the start-up time.

A method for controlling a tunable wavelength laser according to an aspect of the present invention is a method for controlling a tunable wavelength laser by controlling an oscillation wavelength based on a difference between a wavelength sensing result by a wavelength sensing unit and a target value, the method including: a first step of acquiring a driving condition for causing the tunable wavelength laser to conduct laser oscillation at a first wavelength from a memory; a second step of referring to the driving condition of the first wavelength and a wavelength difference between the first wavelength and a second wavelength different from the first wavelength and calculating a driving condition for causing the tunable wavelength laser to conduct laser oscillation at the second wavelength; a third step of driving the tunable wavelength laser based on the driving condition of the second wavelength, performing feedback control that changes the driving condition of the tunable wavelength laser based on a difference between an output of the wavelength sensing unit and the target value, and causing the tunable wavelength laser to oscillate at the second wavelength; a fourth step of storing, in the memory, the driving condition of the tunable wavelength laser obtained by the feedback control when oscillation has occurred at the second wavelength in the third step; and a fifth step of driving the tunable wavelength laser with reference to the driving condition of the tunable wavelength laser stored in the fourth step, the driving condition having been acquired from the memory, after execution of the fourth step.

BRIEF DESCRIPTION OF THE DRAWINGS

FIG. 3 is a diagram illustrating initial setting values and feedback control target values.

FIG. 8 is an example of the required wavelength setting value.

FIG. 11 is a diagram illustrating a correction amount ΔT written in a memory.

DETAILED DESCRIPTION OF THE INVENTION

Description of Embodiments of Invention

Figure 1:
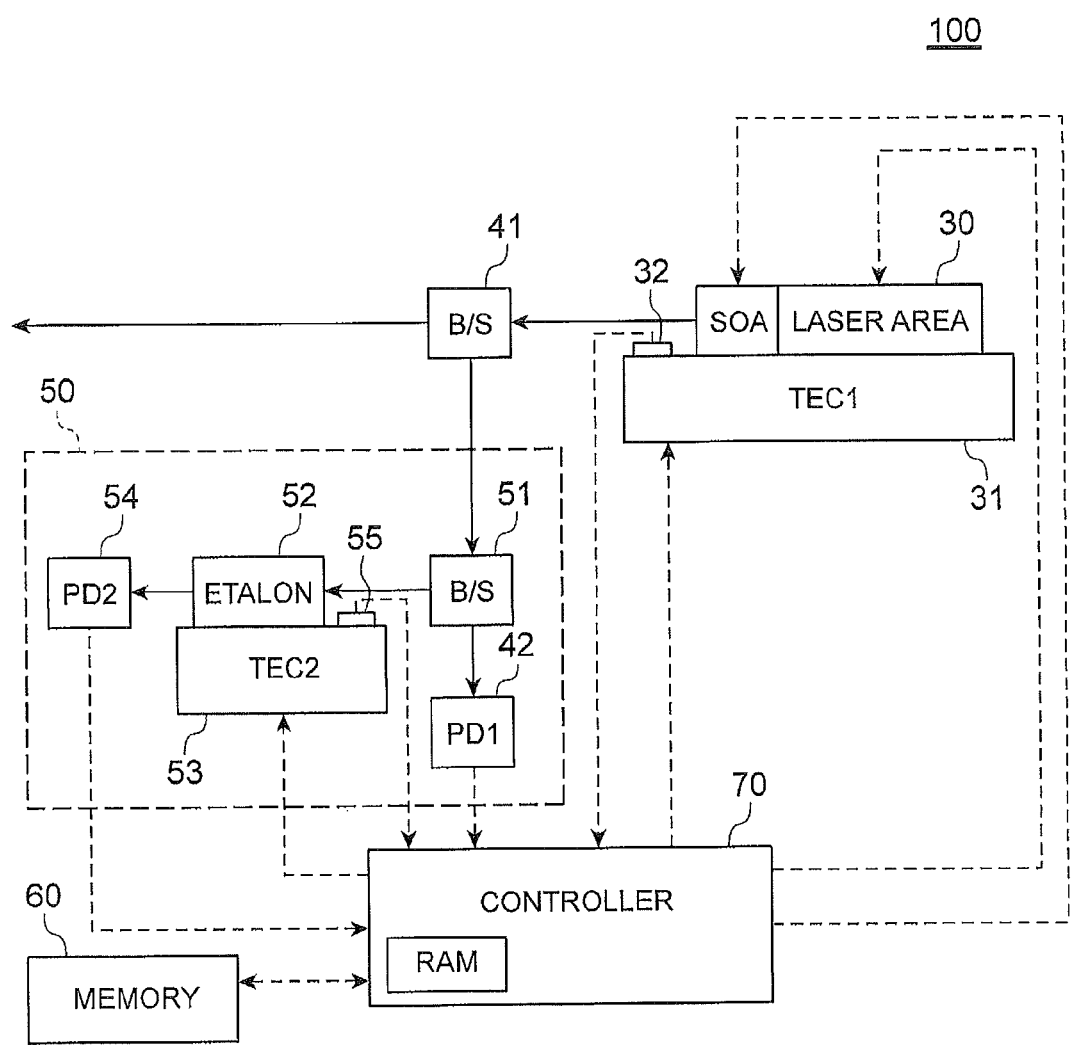
FIG. 1 is a block diagram illustrating an overall configuration of a tunable wavelength laser according to a first embodiment.

First, details of embodiments of the present invention will be listed and explained.

A method for controlling a tunable wavelength laser according to an aspect of the present invention is a method for controlling a tunable wavelength laser by controlling an oscillation wavelength based on a difference between a wavelength sensing result by a wavelength sensing unit and a target value, the method including: a first step of acquiring a driving condition for causing the tunable wavelength laser to conduct laser oscillation at a first wavelength from a memory; a second step of referring to the driving condition of the first wavelength and a wavelength difference between the first wavelength and a second wavelength different from the first wavelength and calculating a driving condition for causing the tunable wavelength laser to conduct laser oscillation at the second wavelength; a third step of driving the tunable wavelength laser based on the driving condition of the second wavelength, performing feedback control that changes the driving condition of the tunable wavelength laser based on a difference between an output of the wavelength sensing unit and the target value, and causing the tunable wavelength laser to oscillate at the second wavelength; a fourth step of storing, in the memory, the driving condition of the tunable wavelength laser obtained by the feedback control when oscillation has occurred at the second wavelength in the third step; and a fifth step of driving the tunable wavelength laser with reference to the driving condition of the tunable wavelength laser stored in the fourth step, the driving condition having been acquired from the memory, after execution of the fourth step.

According to the method for controlling a tunable wavelength laser according to an aspect of the present invention, the start-up time can be shortened.

The tunable wavelength laser may include a semiconductor laser, wavelengths of the tunable wavelength laser can be varied by a temperature control device that controls temperature of the semiconductor laser, and the driving condition of the tunable wavelength laser stored in the memory in the fourth step may be information indicating temperature of the temperature control device. In the second step, a control value of wavelength characteristics regarding the wavelength sensing unit or the target value may be calculated. The wavelength sensing unit may include an etalon, and, in the second step, a control value of temperature of the etalon for obtaining the second wavelength may be calculated. The memory may store a plurality of driving conditions for conducting laser oscillation with respect to different wavelengths, prior to the first step, a step of determining a wavelength that becomes the first wavelength from the memory based on information indicating the second wavelength may be executed, and the first step may include a step of selecting a driving condition regarding the first wavelength from the stored driving conditions.

By means of a method for controlling the wavelength of a tunable wavelength laser according to an aspect of the present invention, the start-up time can be shortened.

DETAILED DESCRIPTION OF EMBODIMENTS OF INVENTION

First Embodiment

Hereinafter, embodiments of the present invention will be described with reference to the accompanying drawings.

FIG. 1 is a block diagram illustrating an overall configuration of a tunable wavelength laser 100 according to a first embodiment. As illustrated in FIG. 1, the tunable wavelength laser 100 includes a semiconductor laser 30, the wavelength of which can be controlled (tunable semiconductor laser), as a laser device. The semiconductor laser 30 according to the present embodiment is provided with an area, which is connected to a laser area and becomes a SOA (Semiconductor Optical Amplifier). The SOA functions as an optical output control unit. The SOA can increase/decrease the intensity of optical output as desired. The SOA can also control the intensity of optical output to be substantially zero. The tunable wavelength laser 100 includes a sensing unit 50, a memory 60, a controller 70, and the like. The sensing unit 50 functions as an output sensing unit and a wavelength locker unit. The controller 70 is configured to control the tunable wavelength laser 100. The controller 70 has a RAM (Random Access Memory) inside it.

Figure 2:
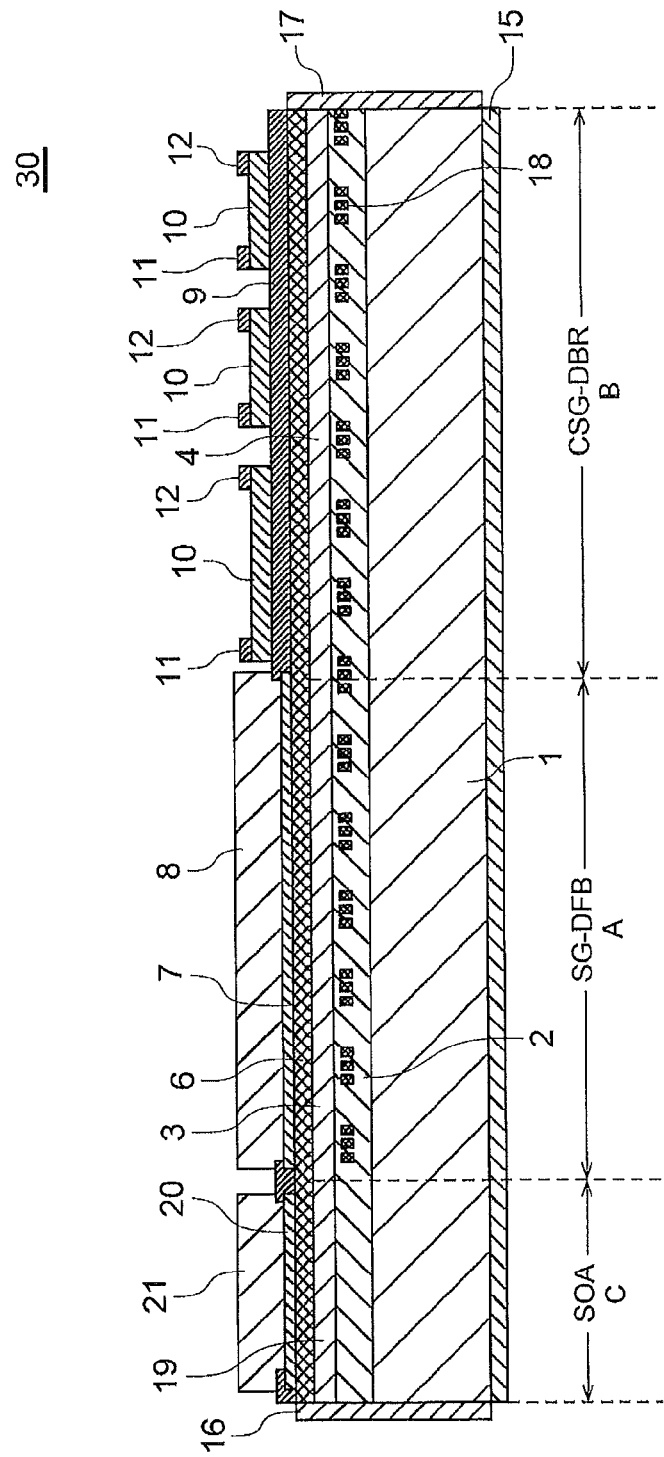
FIG. 2 is a schematic sectional view illustrating an overall configuration of a semiconductor laser according to a first embodiment.

FIG. 2 is a schematic sectional view illustrating an overall configuration of a semiconductor laser 30 according to the present embodiment. As illustrated in FIG. 2, the semiconductor laser 30 includes a SG-DFB (Sampled Grating Distributed Feedback) area A, a CSG-DBR (Chirped Sampled Grating Distributed Bragg Reflector) area B, and a SOA (Semiconductor Optical Amplifier) area C. That is, the semiconductor laser 30 is a laser having a wavelength selection mirror inside the semiconductor structure.

As an example, the semiconductor laser 30 has, spanning from its front side to the rear side, a SOA area C, a SG-DFB area A, and a CSG-DBR area B arranged in this order. The SG-DFB area A has a gain and includes a sampled grating. The CSG-DBR area B has no gain and includes a sampled grating. The SG-DFB area A and the CSG-DBR area B correspond to the laser area of FIG. 1. The SOA area C corresponds to the SOA area of FIG. 2.

The SG-DFB area A has a lower clad layer 2, an active layer 3, an upper clad layer 6, a contact layer 7, and an electrode 8. The lower clad layer 2, the active layer 3, the upper clad layer 6, the contact layer 7, and the electrode 8 are stacked on a substrate 1. The CSG-DBR area B has a lower clad layer 2, an optical waveguide layer 4, an upper clad layer 6, an insulation film 9, and a plurality of heaters 10. The lower clad layer 2, the optical waveguide layer 4, the upper clad layer 6, the insulation film 9, and the plurality of heaters 10 are stacked on the substrate 1. Each heater 10 is provided with a power source electrode 11 and a ground electrode 12. The SOA area C has a lower clad layer 2, an optical amplification layer 19, an upper clad layer 6, a contact layer 20, and an electrode 21. The lower clad layer 2, the optical amplification layer 19, the upper clad layer 6, the contact layer 20, and the electrode 21 are stacked on the substrate 1.

In connection with the SG-DFB area A, the CSG-DBR area B, and the SOA area C, the substrate 1, the lower clad layer 2, and the upper clad layer 6 are formed integrally. The active layer 3, the optical waveguide layer 4, and the optical amplification layer 19 are formed on the same surface. The boundary between the SG-DFB area A and the CSG-DBR area B corresponds to the boundary between the active layer 3 and the optical waveguide layer 4.

An end surface film 16 is formed on end surfaces of the substrate 1, the lower clad 2, the optical amplification layer 19, and the upper clad layer 6, which are adjacent to the SOA area C. The end surface film 16 is an AR (Anti-Reflection) film. The end surface film 16 is a front-side end surface of the semiconductor laser 30. An end surface film 17 is formed on end surfaces of the substrate 1, the lower clad 2, the optical amplification layer 4, and the upper clad layer 6, which are adjacent to the CSG-DBR area B. The end surface film 17 is an AR film. The end surface film 17 is a rear-side end surface of the semiconductor laser 30.

The substrate 1 is a crystal substrate made of n-type InP, for example. The lower clad layer 2 is composed of n-type InP, for example. The upper clad layer 6 is composed of p-type InP, for example. The lower clad layer 2 and the upper clad layer 6 optically confine the active layer 3, the optical waveguide layer 4, and the optical amplification layer 19 from below and above.

The active layer 3 is composed of a semiconductor having a gain. The active layer 3 has a quantum well structure, for example. The active layer 3 has well layers and barrier layers, for example. The well layers and the barrier layers are stacked alternately. The well layers are composed of $Ga_{0.32}In_{0.68}As_{0.92}P_{0.08}$ (thickness: 5 nm). The barrier layers are composed of $Ga_{0.22}In_{0.78}As_{0.47}P_{0.53}$ (thickness: 10 nm). The optical waveguide layer 4 can be composed of a bulk semiconductor layer, for example. The optical waveguide layer 4 is composed of $Ga_{0.22}In_{0.78}As_{0.47}P_{0.53}$, for example. The optical waveguide layer 4 has an energy gap larger than that of the active layer 3.

The optical amplification layer 19 is given a gain by current injection from the electrode 21. As a result, the optical amplification layer 19 conducts optical amplification. The optical amplification layer 19 has a quantum well structure, for example. The optical amplification layer 19 has well layers and barrier layers. The well layers and the barrier layers are stacked alternately. The well layers are composed of $Ga_{0.35}In_{0.65}As_{0.99}P_{0.01}$ (thickness: 5 nm), for example. The barrier layers are composed of $Ga_{0.15}In_{0.85}As_{0.32}P_{0.68}$ (thickness: 10 nm), for example. As another structure, furthermore, it is also possible to employ a bulk semiconductor made of $Ga_{0.44}In_{0.36}As_{0.95}P_{0.05}$, for example. The optical amplification layer 19 and the active layer 3 can also be composed of the same material.

The contact layers 7, 20 can be composed of p-type $Ga_{0.47}In_{0.53}As$ crystals, for example. The insulation film 9 is a protection film. The protection film is composed of silicon nitride (SiN) or silicon oxide (SiO). The heaters 10 are thin-film resistors. The thin-film resistors are composed of titanium tungsten (TiW). Each of the heaters 10 may be formed across a plurality of segments of the CSG-DBR area B.

The electrodes 8, 21, the power supply electrodes 11, and the ground electrodes 12 are composed of a conductive material, such as gold (Au). A back electrode 15 is formed beneath the substrate 1. The back electrode 15 is formed across the SG-DFB area A, the CSG-DBR area B, and the SOA area C.

The end surface film 16 and the end surface film 17 are AR films having a reflection ratio of 1.0% or less. The end surface film 16 and the end surface film 17 have characteristics making their end surfaces substantially non-reflective. The AR films are composed of dielectric films. The dielectric films are composed of $MgF_2$ and TiON, for example. In addition, both ends of the laser are AR films. However, both ends of the laser may also have end surface films 17 composed of reflective films having a meaningful reflection ratio. In the case of a structure providing a light absorption layer on a semiconductor adjoining the end surface film 17 illustrated in FIG. 2, a meaningful reflection ratio of the end surface film 17 can suppress optical output leaking from the end surface film 17 to the outside. The meaningful reflection ratio, as used herein, refers to a reflection ratio of 10% or higher, for example. In addition, the reflection ratio in this connection refers to a reflection ratio with regard to the inside of the semiconductor laser.

Diffraction gratings (corrugation) 18 are formed in a plurality of positions at a predetermined interval on the lower clad layers 2 of the SG-DFB area A and the CSG-DBR area B. A sampled grating is formed in the SG-DFB area A and the CSG-DBR area B. The SG-DFB area A and the CSG-DBR area B are provided with a plurality of segments on the lower clad layers 2. Each segment, as used herein, refers to an area having one diffraction grating portion and a space portion positioned consecutively. Each diffraction grating portion is provided with a diffraction grating 18. Each space portion is provided with no diffraction grating 18. In other words, a segment refers to an area having a space portion, both ends of which are interposed between diffraction grating portions, and a diffraction grating portion connected to each other. The diffraction gratings 18 are composed of a material having a refractive index different from that of the lower clad layers 2. When the lower clad layers 2 are made of InP, the diffraction gratings are composed of $Ga_{0.22}In_{0.78}As_{0.47}P_{0.53}$, for example.

The diffraction gratings 18 are formed by patterning using a two-beam interference exposure method. The space portions are positioned between the diffraction gratings 18. The space portions can be implemented by exposing patterns of the diffraction gratings 18 to light by means of a resist and then performing additional light exposure in positions that correspond to the space portions. The pitch of the diffraction gratings 18 in the SG-DFB area A and the pitch of the diffraction gratings 18 in the CSG-DBR area B may be identical. Furthermore, the pitch of the diffraction gratings 18 in the SG-DFB area A and the pitch of the diffraction gratings 18 in the CSG-DBR area B may be different. The tunable wavelength laser device 200 has, as an example, both pitches set to be identical. In connection with respective segments, the diffraction gratings 18 may have the same length. Furthermore, the diffraction gratings 18 may have different lengths. Respective diffraction gratings 18 of the SG-DFB area A may have the same length. Respective diffraction gratings 18 of the CSG-DBR area B may have the same length. The length of the diffraction gratings 18 of the SG-DFB area A and the length of the diffraction gratings 18 of the CSG-DBR area B may be different from each other.

In the SG-DFB area A, respective segments have substantially the same optical path length. In the CSG-DBR area B, at least two segments have different optical path lengths. The peak-related intensity of wavelength characteristics of the CSG-DBR area B has wavelength dependency. The average optical path length of segments of the SG-DFB area A and the average optical path length of segments of the CSG-DBR area B are different from each other. The segments inside the SG-DFB area A and the segments inside the CSG-DBR area B constitute a resonator in the semiconductor laser 30.

Inside each of the SG-DFB area A and the CSG-DBR area B, reflected light interferes with each other. The SG-DFB area A is provided with an active layer 3. Carrier injection into the SG-DFB area A generates a discrete gain spectrum. This spectrum has a wavelength interval having approximately uniform peak intensities. In the CSG-DBR area B, a discrete reflection spectrum is generated. This spectrum has a wavelength interval having different peak intensities. The intervals of peak wavelengths of wavelength characteristics in the SG-DFB area A and the CSG-DBR area B are different from each other. It is possible to select a wavelength, which meets the oscillation condition, by using the Vernier effect resulting from a combination of such wavelength characteristics.

As illustrated in FIG. 1, the semiconductor laser 30 is arranged on a first temperature control device 31. The first temperature control device 31 includes a Peltier element. The first temperature control device 31 functions as a TEC (Thermoelectric Cooler). The first thermistor 32 is arranged on the first temperature control device 31. The first thermistor 32 detects the temperature of the first temperature control device 31. It is possible to specify the temperature of the semiconductor laser 30 based on the detection temperature of the first thermistor 32.

The tunable wavelength laser 100 includes a sensing unit 50. The sensing unit 50 is arranged on the front side of the semiconductor laser 30. The sensing unit 50 functions as a wavelength locker unit. Therefore, the tunable wavelength laser 100 can be called a front locker type. The sensing unit 50 includes a first light-receiving element 42, a beam splitter 51, an etalon 52, a second temperature control device 53, a second light-receiving element 54, and a second thermistor 55.

The beam splitter 41 is positioned to split output light from the front side of the semiconductor laser 30. The beam splitter 51 is positioned to split light from the beam splitter 41. The first light-receiving element 42 is positioned to receive one of two portions of light split by the beam splitter 51. The etalon 52 is positioned to transmit the other of the two portions of light split by the beam splitter 51. The second light-receiving element 54 is positioned to receive transmitted light that has passed through the etalon 52.

The etalon 52 has characteristics of periodically changing its transmission ratio in response to the wavelength of incident light. In the present embodiment, a solid etalon is used as the etalon 52. The corresponding periodic wavelength characteristics of the solid etalon change in response to a temperature change. The etalon 52 is positioned to transmit the other of the two portions of light split by the beam splitter 51. The etalon 52 is arranged on the second temperature control device 53. The second temperature control device 53 includes a Peltier element. The second temperature control device 53 functions as a TEC (Thermoelectric Cooler).

The second light-receiving element 54 is positioned to receive transmitted light that has passed through the etalon 52. The second thermistor 55 specifies the temperature of the etalon 52. The second thermistor 55 is arranged on the second temperature control device 53, for example. In the present embodiment, the temperature of the etalon 52 is specified by detecting the temperature of the second temperature control device 53 by the second thermistor 55.

The memory 60 is a rewritable memory device. The rewritable memory device may typically be a flash memory. The controller 70 includes a CPU (Central Processing Unit), a RAM (Random Access Memory), a power supply, and the like. The RAM is a memory configured to temporarily memorize a program executed by the CPU, data processed by the CPU, and the like.

The memory 60 has initial setting values and feedback control target values of respective components of the tunable wavelength laser 100 memorized so as to correspond to channels. The channels, as used herein, refer to numbers corresponding to oscillation wavelengths of the semiconductor laser 30. For example, respective channels correspond to grid wavelengths of ITU-T (International Telecommunication Union Telecommunication Standardization Sector). In the present embodiment, the wavelength of each channel is defined as a fundamental wavelength.

FIG. 3 is a diagram illustrating the above-mentioned initial setting values and feedback control target values. As illustrated in FIG. 3, the above-mentioned initial setting values include initial current values $I_{LD}$, initial current values $I_{SOA}$, initial temperature values $T_{LD}$, initial temperature values $T_{Etalon}$, and initial power values $P_{Heater1}$-$P_{Heater3}$. The initial current values $I_{LD}$ are current values supplied to the electrode 8 of the SG-DFB area A. The initial current values $I_{SOA}$ are current values supplied to the electrode 21 of the SOA area C. The initial temperature values $T_{LD}$ are temperatures of the semiconductor laser 30. The initial temperature values $T_{Etalon}$ are temperatures of the etalon 52. The initial power values $P_{Heater1}$-$P_{Heater3}$ are power values supplied to respective heaters 10. These initial setting values are determined with respect to respective channels. The feedback control target values are target values when performing feedback control of the controller 70. The feedback control target values include target value $I_m$ and target value $I_{m2}/I_{m1}$. The target value $I_m$ is a target value of a photocurrent outputted by the first light-receiving element 42. The target value $I_{m2}/I_{m1}$ is a target value of a ratio of a photocurrent $I_{m2}$ outputted by the second light-receiving element 54 with regard to a photocurrent $I_{m1}$ outputted by the first light-receiving element 42. The control target values are determined with respect to respective channels. The memory 60 has a temperature correction coefficient C1 stored therein. Details of the temperature correction coefficient C1 will be described later. In the present embodiment, the temperature correction coefficient C1 is a value common to respective channels. Furthermore, each of these values is obtained for each individual object by means of tuning using a wavemeter, prior to shipping of the tunable wavelength laser 100.

Figure 4:
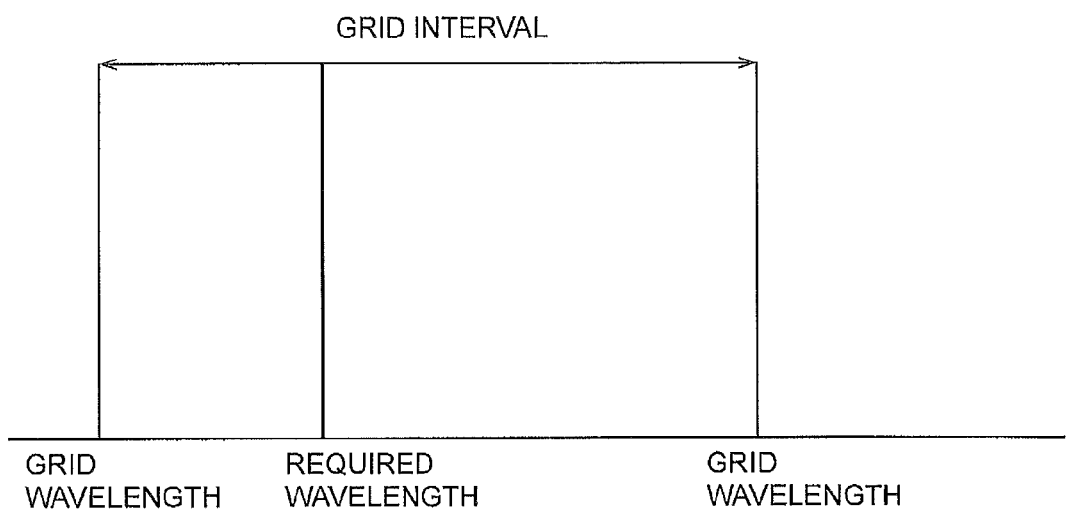
FIG. 4 is a diagram illustrating a relationship between a required wavelength and a fundamental wavelength in connection with the gridless control.

The tunable wavelength laser 100 according to the present embodiment can output the required wavelength even if the required wavelength does not coincide with the fundamental wavelength. Control that enables output at a wavelength different from the fundamental wavelength will hereafter be referred to as gridless control. FIG. 4 is a diagram illustrating a relationship between a required wavelength and a fundamental wavelength in connection with the gridless control. As illustrated in FIG. 4, in the case of the gridless control, a required wavelength is a wavelength between a fundamental wavelength and another fundamental wavelength adjacent to it. In addition, the required wavelength does not need to coincide with the fundamental wavelength.

Figure 5:
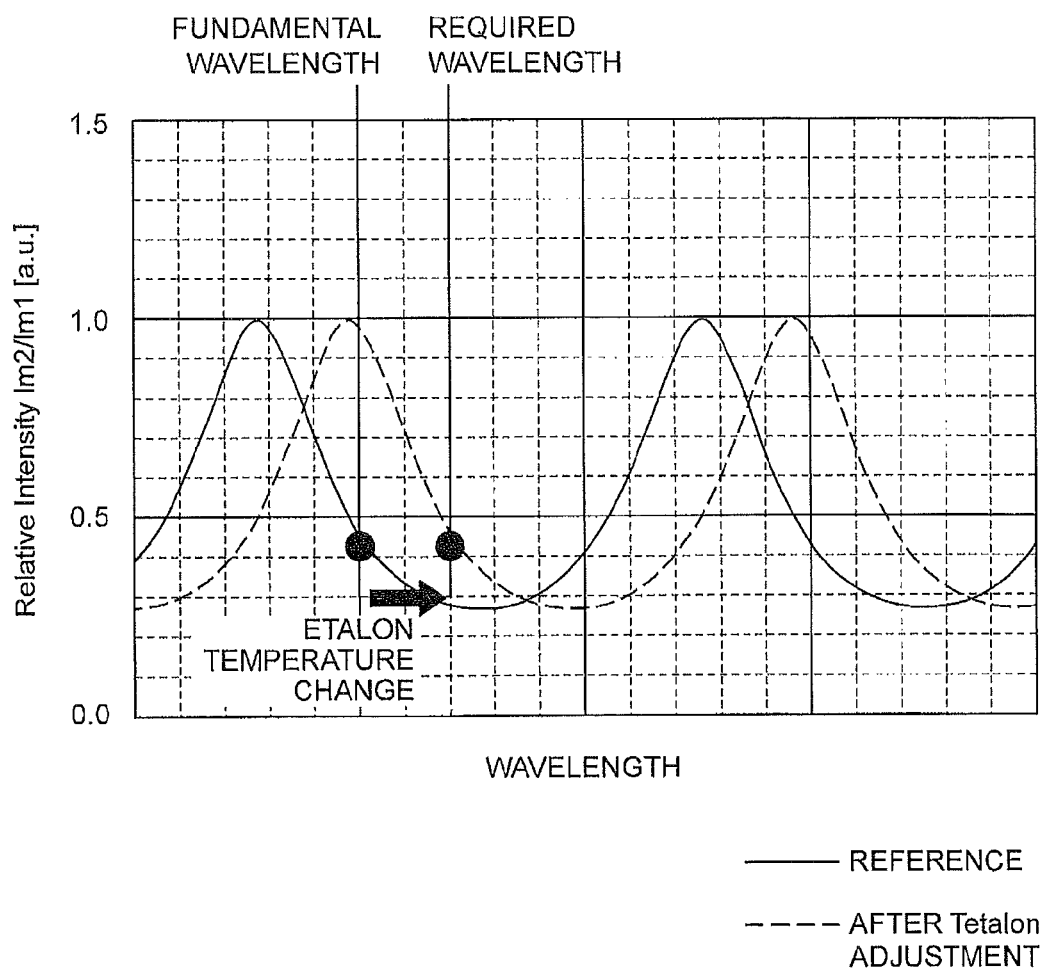
FIG. 5 is a diagram illustrating the principle of gridless control.

FIG. 5 is a diagram illustrating the principle of gridless control. In FIG. 5, the axis of abscissa indicates wavelengths. The axis of ordinate indicates normalized values of ratio $I_{m2}/I_{m1}$ (transmission ratio of the etalon 52). In FIG. 5, the solid line corresponds to wavelength characteristics corresponding to the initial temperature value $T_{Etalon}$ of the etalon 52. The dotted line corresponds to wavelength characteristics when the temperature of the etalon 52 has been raised by the second temperature control device 53. It will be assumed in this regard that the ratio $I_{m2}/I_{m1}$ associated with the black circle on the solid line is a feedback target value. In this case, when the temperature of the etalon 52 is the initial temperature value $T_{Etalon}$, oscillation occurs at the fundamental wavelength. On the other hand, it will be assumed that the temperature of the etalon 52 corresponds to wavelength characteristics indicated by the dotted line. In this case, even if the ratio $I_{m2}/I_{m1}$ is a value for obtaining a fundamental wavelength (black circle on the dotted line), the actual oscillation wavelength shifts from the fundamental wavelength as much as the amount of change of etalon characteristics. In summary, the required wavelength can be implemented by shifting the etalon characteristics as much as the wavelength difference between the required wavelength and the fundamental wavelength, without any change of the ratio $I_{m2}/I_{m1}$, which is a feedback target value. In other words, computation for changing the etalon temperature based on the wavelength difference ΔF between the required wavelength and the fundamental wavelength is conducted. By applying this as the etalon temperature, then, the required wavelength can be implemented.

As described, the wave characteristics of the etalon 52 shift according to its temperature. The frequency variation amount/temperature change amount [GHz/° C.] regarding the etalon 52 will be referred to as a temperature correction coefficient C1 of the etalon 52. In addition, wavelengths are expressed by frequencies herein. The temperature correction coefficient C1 corresponds to a rate of change with respect to a wavelength change of the driving condition of the tunable wavelength laser.

It will be assumed that a setting temperature of the etalon 52 for implementing control of the required wavelength is $T_{etln\_A}$ [° C.]. It is assumed that the initial temperature of the etalon 52, i.e. temperature of the etalon 52 corresponding to a selected fundamental wavelength is $T_{etln\_B}$ [° C.]. $T_{etln\_B}$ corresponds to $T_{Etalon}$. In addition, $T_{etln\_B}$ is acquired from the memory 60. It is assumed that the wavelength difference (absolute value) between the fundamental wavelength and the required wavelength is ΔF [GHz]. In this case, the relationship between respective parameters can be expressed as in Equation (1) below. It is possible to acquire a setting temperature $T_{etln\_A}$, which is needed to obtain the required wavelength, based on Equation (1).

$$T_{etln\_A} = T_{etln\_B} + \Delta F/C1 \qquad (1)$$

It is possible to obtain the required wavelength, while using the ratio $I_{m2}/I_{m1}$ without changing it, by controlling the temperature of the second temperature control device 53 to the setting temperature $T_{etln\_A}$.

Execution of the above-described operation enables the semiconductor laser 30 to conduct laser oscillation by means of a wavelength (required wavelength) shifted from the fundamental wavelength as much as the amount of shift of characteristics of the etalon 52, as illustrated in FIG. 5.

It is possible to change the oscillation wavelength of the semiconductor laser 30 not only by changing the setting temperature of the etalon 52, but also by changing the temperature of the semiconductor laser 30. It will be assumed in this regard that the ratio of the amount of temperature change of the semiconductor laser 30 and the amount of oscillation wavelength change thereof is predetermined as a temperature correction coefficient C2. This temperature correction coefficient C2 may be used to calculate a temperature value $T_{LD}$, which is necessary for the semiconductor laser 30 to oscillate at the required wavelength, from the wavelength difference $\Delta F$. In addition, the temperature value $T_{LD}$ is a target temperature value of the first temperature control device 31.

Figure 6:
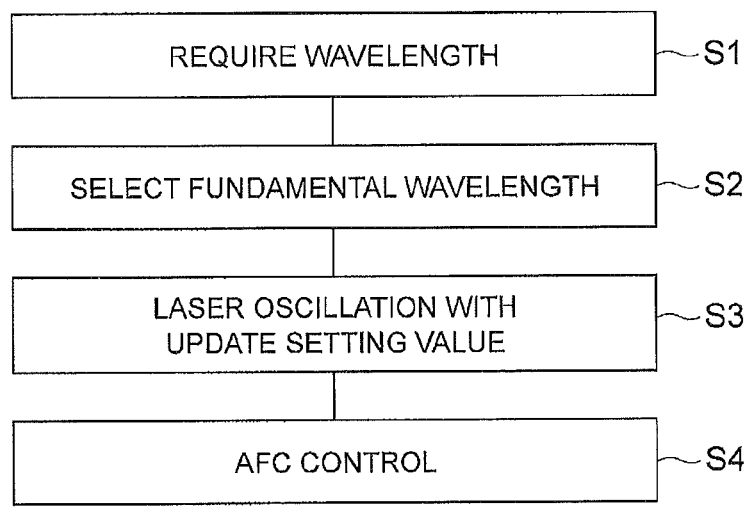
FIG. 6 is an exemplary flowchart illustrating the gridless control.

FIG. 6 is an exemplary flowchart illustrating the gridless control. First, the controller 70 acquires information indicating the required wavelength from the outside (step S1). The controller 70 selects a fundamental wavelength, which is closest to the required wavelength, from the memory 60 based on the information indicating the required wavelength (step S2). Subsequently, the controller 70 calculates an update setting value based on the wavelength difference $\Delta F$ between the required wavelength and the fundamental wavelength. The controller 70 then causes the semiconductor laser 30 to conduct laser oscillation using the update setting value (step S3). According to the present embodiment, the update setting value is used so that, in connection with the feedback control target value and the initial setting value of the selected fundamental wavelength, the initial temperature value $T_{LD}$ of the semiconductor laser 30 is rewritten into the above-mentioned calculated temperature value $T_{LD}$. In addition, according to the present embodiment, the update setting value is used so that the initial temperature value $T_{Etalon}$ of the etalon 52 is rewritten into the above-mentioned calculated setting temperature $T_{etln\_A}$.

Next, the controller 70 conducts AFC (Automatic Frequency Control) control using the feedback control target value included in the update setting value (step S4). The AFC control is automatic wavelength control. The AFC control uses the first temperature control device 31 and controls the temperature of the semiconductor laser 30 so that $I_{m2}/I_{m1}$ of the feedback control target value is implemented. As a result of the above processing, the required wavelength is implemented.

Figure 7:
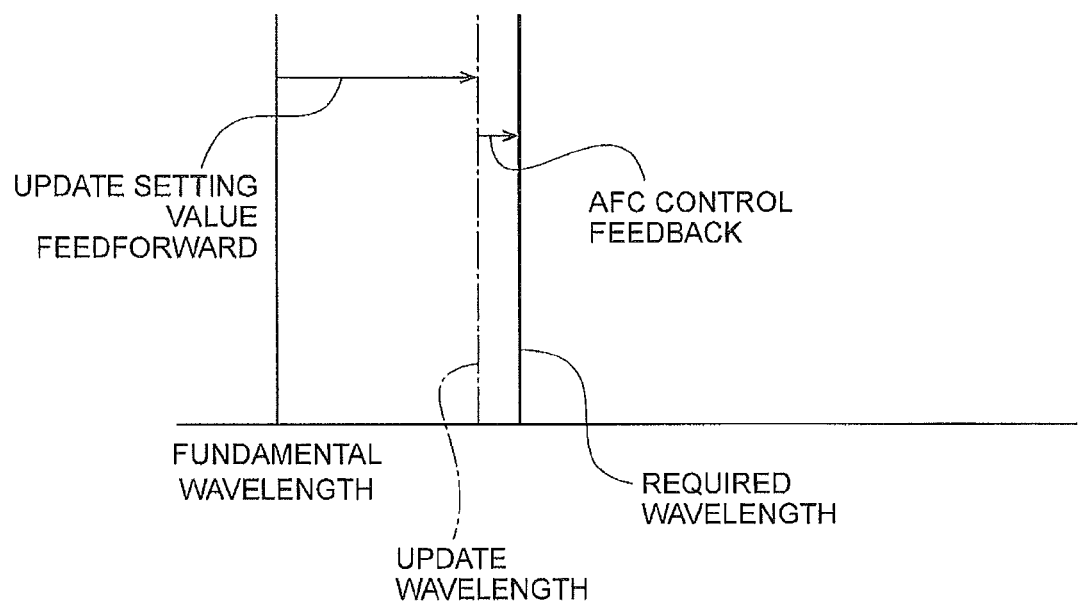
FIG. 7 is a diagram illustrating a relationship between respective wavelengths in connection with the gridless control.

FIG. 7 is a diagram illustrating a relationship between respective wavelengths in connection with the gridless control. As illustrated in FIG. 7, when a required wavelength is inputted, a fundamental wavelength closest to the required wavelength is selected, for example. Next, an update setting value for implementing the required wavelength is calculated. Then, the update setting value is used to implement laser oscillation. The control in this case corresponds to feedforward control. In addition, the update setting value is a setting value for implementing the required wavelength. However, in actual cases, there may be deviation from the required wavelength. Therefore, a wavelength actually implemented by the update setting value is referred to as an update wavelength. Next, the required wavelength is implemented by AFC control. The control in this case corresponds to feedback control.

In the present embodiment, when the required wavelength has been implemented by gridless control, the controller 70 writes a control value for implementing the required wavelength in the memory 60 as a required wavelength setting value. FIG. 8 is an example of the required wavelength setting value. As illustrated in FIG. 8, the required wavelength setting value includes a current value $I_{LD}$, a current value $I_{SOA}$, a temperature value $T_{LD}$, a temperature value $T_{Etalon}$, and power values $P_{Heater1}$-$P_{Heater3}$. The current value $I_{LD}$ is a current value supplied to the electrode 8 of the SG-DFB area A. The current value $I_{SOA}$ is a current value supplied to the electrode 21 of the SOA area C. The temperature value $T_{LD}$ is a temperature of the semiconductor laser 30. The temperature value $T_{Etalon}$ is a temperature of the etalon 52. The power values $P_{Heater1}$-$P_{Heater3}$ are power values supplied to respective heaters 10. The temperature value $T_{Etalon}$ is the calculated setting temperature $T_{etln\_A}$. The temperature value $T_{LD}$ is a value when AFC control is stable.

Wavelength information is an actual wavelength. The wavelength information may also be a channel number. In this case, it is also possible that, among fundamental wavelengths corresponding to the data table illustrated in FIG. 8, a wavelength that is the maximum value or the minimum value (start grid wavelength) and a wavelength difference between grids (grid interval wavelength) are recorded. The controller 70 may assign an indicated required wavelength channel number based on such parameters.

When a required wavelength implemented by the required wavelength setting value written in the memory 60 is required at the next start-up or later, the controller 70 does not use the initial setting value of FIG. 3, but uses the corresponding required wavelength setting value and makes the semiconductor laser 30 conduct laser oscillation. Therefore, the start-up time can be shortened. Furthermore, a start-up condition that has already been implemented is used. Therefore, any deviation of the temperature target value of the semiconductor laser 30 resulting from degradation is suppressed. Therefore, reliability during start-up improves.

Figure 9:
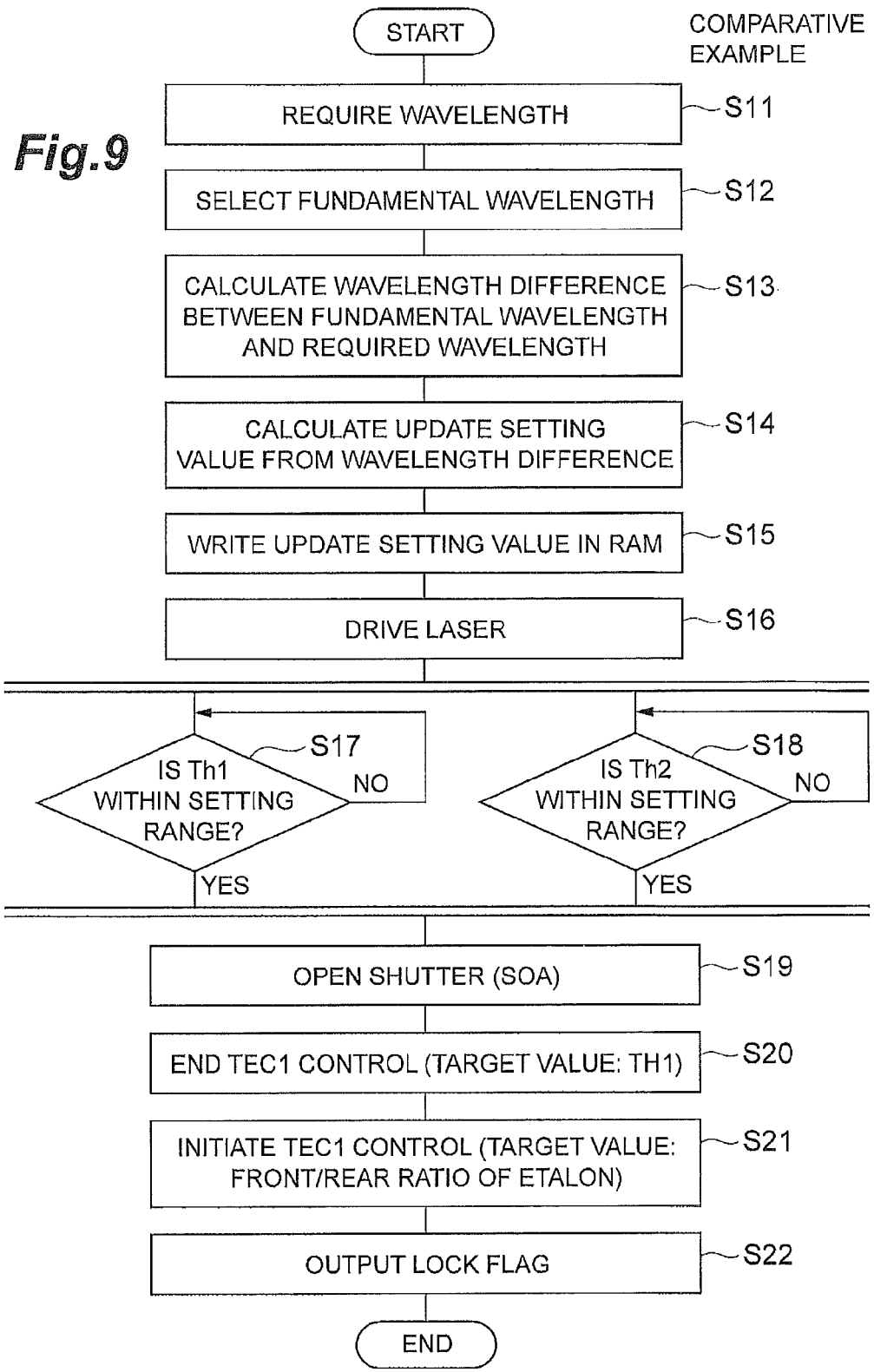
FIG. 9 is a flowchart illustrating a start-up procedure according to a comparative example.

FIG. 9 is a flowchart illustrating a start-up procedure according to a comparative example. In the comparative example, the required wavelength setting value is not written in the memory 60, but the same processing is conducted during start-up and during re-start-up. As illustrated in FIG. 9, the controller 70 receives a wavelength request (step S11). The required wavelength is inputted from an external input/output device (not illustrated). Typically, an input/output device conforming to RS232C standards is employed. Next, the controller 70 selects a fundamental wavelength, which is closest to the required wavelength, for example (step S12).

Next, the controller 70 calculates the wavelength difference $\Delta F$ between the fundamental wavelength and the required wavelength (step S13). Next, the controller 70 calculates an update setting value (step S14). Next, the controller 70 writes the update setting value in its own RAM (step S15). Next, the controller 70 drives the semiconductor laser 30 using the update setting value written in the RAM (step S16). In addition, control is conducted so that, in the SOA area C, light is not outputted from the semiconductor laser 30 at this time.

Next, the controller 70 conducts ATC (Automatic Temperature Control) control so that the detection temperature $T_{H1}$ of the first thermistor 32 falls within the range of $T_{LD}$. Furthermore, the controller 70 determines whether the detection temperature $T_{H1}$ of the first thermistor 32 is within the range of $T_{LD}$ or not (step S17). The range of $T_{LD}$, in this case, is a range having the temperature value $T_{LD}$ of the update setting value at its center. When "No" is determined in step S17, the controller 70 adjusts the current value, which is supplied to the first temperature control device 31, so that the detection temperature $T_{H1}$ of the first thermistor 32 approaches the temperature value $T_{LD}$.

The controller 70 conducts ATC (Automatic Temperature Control) control so that the detection temperature $T_{H2}$ of the second thermistor 55 falls within a setting range, in parallel with step S17. Furthermore, the controller 70 determines whether the detection temperature $T_{H2}$ of the second thermistor 55 is within the setting range or not (step S18). The setting range in this case is determined based on the setting temperature $T_{etln\_A}$ included in the update setting value. For example, the setting range can be a range having the setting temperature $T_{etln\_A}$ at its center. When "No" is determined in step S18, the controller 70 changes the current value, which is supplied to the second temperature control device 53, so that the detection temperature $T_{H2}$ of the second thermistor 55 approaches the setting temperature $T_{etln\_A}$. In addition, even when "Yes" is determined in step S18, operations of ATC control by the second temperature control device 53 described above continue.

The controller 70 stands by until "Yes" is determined in both steps S17 and S18. When "Yes" is determined in both steps S17 and S18, the controller 70 opens the shutter (step S19). Specifically, APC (Automatic Power Control) control is conducted. According to this APC control, the current supplied to the electrode 21 of the SOA area C is controlled to the initial current value $I_{SOA}$. As a result, laser light of the update wavelength is outputted from the semiconductor laser 30. In addition, operations of the APC (Automatic Power Control) control continue even in step 19.

Next, the controller 70 ends the temperature control by the first temperature control device 31, which uses the temperature value $T_{LD}$ as the control target, (step S20). Next, the controller 70 initiates AFC control by the first temperature control device 31 (step S21). That is, the controller 70 conducts feedback control so that the temperature of the first temperature control device 31 satisfies the ratio $I_{m2}/I_{m1}$ of the feedback control target value. The ratio of input light and output light of the etalon 52 (front/rear ratio) indicates the oscillation wavelength of the semiconductor laser 30. The first temperature control device 31 is a parameter that controls the wavelength of the semiconductor laser 30. In step S21, the temperature of the first temperature control device 31 is subjected to feedback control so that the front/rear ratio becomes $I_{m2}/I_{m1}$. As a result of this control, AFC control that controls the wavelength of the semiconductor laser 30 is conducted. Therefore, the required wavelength is implemented. The controller 70 confirms that the ratio $I_{m2}/I_{m1}$ is within a range that has, at its center, the target value $I_{m2}/I_{m1}$ regarding the fundamental wavelength selected in step S2. The controller 70 then outputs a lock flag (step S22). Thereafter, execution of the flowchart is ended.

Figure 10:
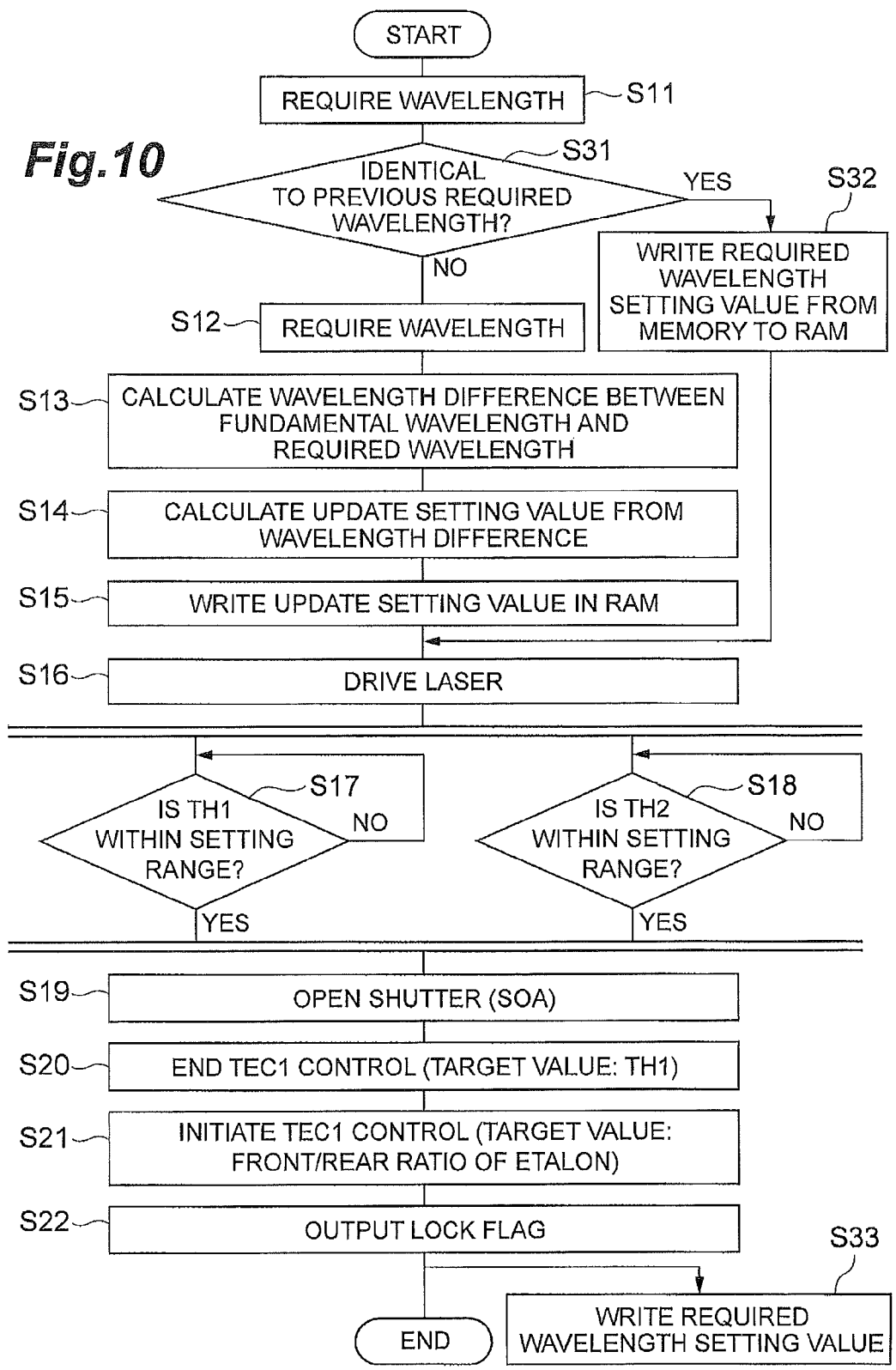
FIG. 10 is a flowchart illustrating a start-up procedure according to the first embodiment.

FIG. 10 is a flowchart illustrating a start-up procedure according to the present embodiment. Differences from FIG. 9 will be described. After executing step S11, the controller 70 determines whether the required wavelength, which has been inputted in step S11, coincides with a previously implemented required wavelength or not (step S31). When "Yes" is determined in step S31, the controller 70 reads a required wavelength setting value illustrated in FIG. 8, which corresponds to the required wavelength, from the memory 60. Then, the controller 70 writes it in its own RAM (step S32). Thereafter, processing proceeds from step S16. When "No" is determined in step S31, processing proceeds from step S12. After executing step S22, the controller 70 associates the required wavelength setting value illustrated in FIG. 8 with the required wavelength and writes the value in the memory 60 (step S33). The ATC control proceeding in step S18, the APC control proceeding in step S19, and the AFC control proceeding in step S21 continue respectively. Therefore, the required wavelength setting value illustrated in FIG. 8 is always updated. Therefore, the writing-in of the required wavelength setting value in step S33 is conducted in a desired opportunity, so that new data is written in the required wavelength setting value illustrated in FIG. 8.

According to the present embodiment, unlike the comparative example, when a required wavelength implemented by the required wavelength setting value written in the memory 60 is required, the initial setting value of FIG. 3 is not used, but the corresponding required wavelength setting value is used to make the semiconductor laser 30 conduct laser oscillation. Therefore, the start-up time can be shortened. Furthermore, a start-up condition that has already been implemented is used. Therefore, any deviation of the temperature target value of the semiconductor laser 30 resulting from degradation is suppressed. Therefore, reliability during start-up improves.

Second Embodiment

In the case of the tunable wavelength laser 100 according to the first embodiment, the required wavelength setting value of FIG. 6 is written in the memory 60 when the required wavelength is implemented, but the present invention is not limited thereto. For example, a correction amount ΔT may be associated with the corresponding required wavelength and written in the memory 60. The correction amount ΔT is an amount of correction of the temperature value of the semiconductor laser 30 when the required wavelength is implemented under stable AFC control. In addition, the correction amount ΔT is a value satisfying $T_{LD}=T_{LD}'+\Delta T$ when a temperature value $T_{LD}$ under stable AFC control is $T_{LD}$, and the temperature value $T_{LD}$ of the update setting value is $T_{LD}'$. FIG. 11 is a diagram illustrating the correction amount ΔT written in the memory 60.

The controller 70 according to the present embodiment calculates the update setting value based on the wavelength difference ΔF. Next, the controller 70 obtains a temperature value $T_{LD}$ by adding the correction amount ΔT, which is written in the memory 60, to the temperature value $T_{LD}$ ($T_{LD}'$) of the update setting value. Then, the corresponding temperature value ($T_{LD}$) is regarded as the target temperature of the first temperature control device 31. Therefore, the start-up time can be shortened. Furthermore, a start-up condition that has already been implemented is used. Therefore, any deviation of the temperature target value of the semiconductor laser 30 resulting from degradation is suppressed. Therefore, reliability during start-up improves.

Figure 12:
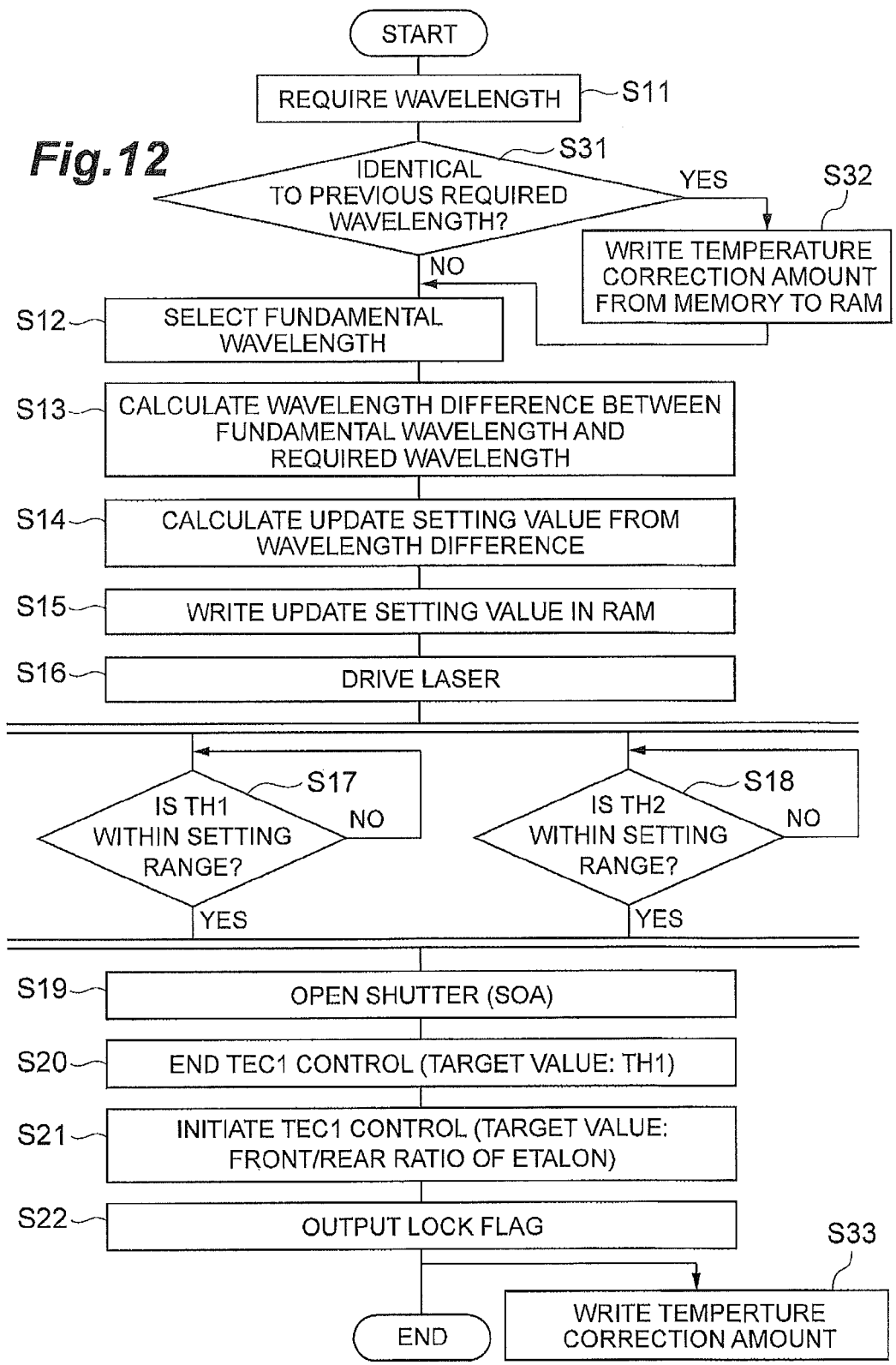
FIG. 12 is a flowchart illustrating a start-up procedure according to a second embodiment.

FIG. 12 is a flowchart illustrating an start-up procedure according to the present embodiment. Differences from FIG. 9 will be described. After executing step S11, the controller 70 determines whether the required wavelength, which has been inputted in step S11, coincides with a previously implemented required wavelength or not (S31). When "Yes" is determined in step S31, the controller 70 reads the temperature correction amount ΔT from the memory 60. Then, the controller 70 writes the temperature correction amount ΔT in its own RAM (step S32). Thereafter, processing proceeds from step S12. In step S16, the controller 70 obtains a temperature value $T_{LD}$ by adding the correction amount ΔT to the temperature value $T_{LD}$ ($T_{LD}'$) of the update setting value. Then, the controller 70 regards it as the target temperature of the first temperature control device 31. After executing step S22, the controller 70 associates the temperature correction amount ΔT with the required wavelength and writes it in the memory 60 (step S33). In addition, the temperature correction amount ΔT written in step S33 is a temperature correction amount obtained by AFC control of step S21.

Although a solid etalon is employed as the etalon 52 in the above-described embodiments, it is also possible to employ a different etalon. For example, a liquid-crystal etalon having a liquid-crystal layer interposed between mirrors may be used. In this case, wavelength characteristics of the liquid-crystal etalon can be shifted by controlling the voltage applied to liquid crystals. It is also possible to use an air gap etalon capable of changing the gap length between mirrors in response to the applied voltage. In this case, wavelength characteristics of the air gap etalon can be shifted by controlling the applied voltage. In the case of either the liquid-crystal etalon or the air gap etalon, temperature control is conducted by the second temperature control device 53. However, the temperature control in this case is not for the purpose of shifting wavelength characteristics, but for the purpose of preventing any variation of wavelength characteristics resulting from temperature factors. For this reason, the temperature is controlled constantly.

In addition, in the above-described embodiments, the fundamental wavelength can be referred to as a first wavelength. In addition, the required wavelength can be referred to as a second wavelength. In addition, the required wavelength setting value can be referred to as wavelength information of the second wavelength.

Although embodiments of the present invention have been described in detail above, the present invention is not limited to any specific embodiment related thereto, but various changes and modifications can be made within the scope of the gist of the present invention as described in the accompanying claims.

What is claimed is:

1. A method of setting an oscillation wavelength of a tunable wavelength laser in a required wavelength, the tunable wavelength laser including a wavelength sensing unit and a memory, the wavelength sensing unit sensing the oscillation wavelength currently attributed to the tunable wavelength laser, the required wavelength being offset from wavelengths with a preset interval and attributed to driving conditions that are stored in the memory in advance to an operation of the tunable wavelength laser, the method comprising steps of:

acquiring one of the driving conditions of the tunable wavelength laser from the memory;

calculating a next driving condition corresponding to the required wavelength from the one of the driving conditions acquired from the memory and a difference between the required wavelength and one of the wavelengths attributed to the one of the driving conditions;

iterating steps of driving the tunable wavelength laser by the next driving condition, comparing the wavelength sensed by the wavelength sensing unit with the required wavelength, and revising the next driving condition by a difference between the wavelength currently sensed by the sensing unit and the required wavelength;

when the wavelength currently sensed by the wavelength sensing unit coincides with the required wavelength, revising the next driving condition of the tunable wavelength laser in the memory; and driving the tunable wavelength laser by the next driving condition of the tunable wavelength laser that is stored in the memory.

2. The method according to claim 1, wherein the tunable wavelength laser further includes a temperature control device, and wherein the tunable wavelength laser comprises a semiconductor laser whose oscillation wavelength depends on a temperature thereof that is controlled by the temperature control device, and wherein the next driving condition of the tunable wavelength laser stored in the memory is a temperature of the temperature control device under which the oscillation wavelength of the semiconductor laser coincides with the required wavelength.

3. The method according to claim 1, wherein the wavelength sensing unit includes an etalon and wherein the step of calculating the next driving condition includes a step of calculating a temperature of the etalon under which the etalon shows predetermined transmittance at the required wavelength.

4. The method according to claim 1, wherein the wavelengths attributed to the driving conditions stored in the memory correspond to grid wavelengths determined by an international telecommunication union telecommunication (ITU-T) standard, wherein the method further includes a step, prior to the step of acquiring the one of the driving conditions, determining one of the grid wavelengths, and wherein the step of acquiring the one of the driving condition includes a step of selecting the one of the driving conditions corresponding to the one of the grid wavelengths.

5. The method according to claim 1, wherein the one of the driving conditions acquired from the memory corresponds to one of the wavelengths closest to the required wavelength.

* * * * *